(12) United States Patent
Chang

(10) Patent No.: US 11,075,474 B2
(45) Date of Patent: Jul. 27, 2021

(54) DISPLAY MODULE

(71) Applicant: Darwin Precisions Corporation, Hsinchu County (TW)

(72) Inventor: Chi-Fu Chang, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 21 days.

(21) Appl. No.: 16/749,147

(22) Filed: Jan. 22, 2020

(65) Prior Publication Data

US 2021/0111502 A1 Apr. 15, 2021

(30) Foreign Application Priority Data

Oct. 14, 2019 (TW) ................... 108136915

(51) Int. Cl.
| | |
|---|---|
| *H05K 1/00* | (2006.01) |
| *H01R 12/62* | (2011.01) |
| *H01R 12/65* | (2011.01) |
| *H05K 1/18* | (2006.01) |
| *H05K 5/00* | (2006.01) |

(52) U.S. Cl.
CPC ............. *H01R 12/62* (2013.01); *H01R 12/65* (2013.01); *H05K 1/181* (2013.01); *H05K 1/189* (2013.01); *H05K 5/0017* (2013.01); *H05K 2201/10189* (2013.01)

(58) Field of Classification Search
CPC ........ H01R 12/62; H01R 12/65; H05K 1/181; H05K 5/0017; H05K 1/189; H05K 2201/10189
See application file for complete search history.

(56) References Cited

U.S. PATENT DOCUMENTS

| | | | |
|---|---|---|---|
| 6,406,328 B1* | 6/2002 | Attarian ............... | H01H 71/123 439/502 |
| 9,295,169 B1* | 3/2016 | Spinner .............. | G01R 31/2834 |
| 2010/0220072 A1* | 9/2010 | Chien .................... | G06F 3/041 345/173 |
| 2011/0092100 A1* | 4/2011 | Coffey ................. | H01R 13/518 439/620.22 |
| 2013/0314883 A1* | 11/2013 | Ling ...................... | H05K 1/189 361/749 |
| 2014/0332257 A1 | 11/2014 | Jee et al. | |
| 2015/0189768 A1* | 7/2015 | Kishida .................. | H05K 1/147 361/749 |
| 2015/0370113 A1 | 12/2015 | Kim et al. | |
| 2016/0029503 A1* | 1/2016 | Shedletsky ............ | H05K 1/147 361/679.02 |

(Continued)

FOREIGN PATENT DOCUMENTS

| | | |
|---|---|---|
| CN | 109064897 A | 12/2018 |
| TW | 201444437 A | 11/2014 |
| TW | 201805910 A | 2/2018 |

*Primary Examiner* — Yuriy Semenenko

(74) *Attorney, Agent, or Firm* — WPAT, PC

(57) ABSTRACT

A display module including display panel, first flexible connectors, second flexible connectors and printed circuit board (PCB) is provided. The first flexible connectors are electrically connected to the display panel. The second flexible connectors are respectively electrically connected to the first flexible connectors, and the second flexible connectors are electrically connected to the PCB.

9 Claims, 3 Drawing Sheets

(56) References Cited

U.S. PATENT DOCUMENTS

| | | | |
|---|---|---|---|
| 2016/0066410 A1* | 3/2016 | Cho | H05K 1/028 |
| | | | 361/749 |
| 2016/0081193 A1* | 3/2016 | Leggett | H05K 7/1427 |
| | | | 361/749 |
| 2017/0318688 A1 | 11/2017 | Kim et al. | |
| 2017/0318689 A1 | 11/2017 | Kim et al. | |
| 2019/0187506 A1* | 6/2019 | Yun | H05K 1/189 |
| 2019/0208650 A1 | 7/2019 | Kim et al. | |
| 2020/0015356 A1* | 1/2020 | Park | G02F 1/133308 |
| 2020/0068733 A1* | 2/2020 | Lee | H05K 1/147 |

* cited by examiner

DISPLAY MODULE

CROSS-REFERENCE TO RELATED APPLICATION

This application claims priority to Taiwan Application Serial Number 108136915, filed Oct. 14, 2019, which is herein incorporated by reference in its entirety.

BACKGROUND

Field of Disclosure

The present disclosure relates to an optical device. More particularly, the present disclosure relates to a display module.

Description of Related Art

With the advancements of technical progress, flat-panel displays such as liquid crystal displays (LCD), organic light-emitting diode displays (OLED display), etc. have been widely applied in people's life and work. However, as the demands for, for instance, advertisements in public areas, indoor gaming and entertainment increases, curved screen displays have become one of the main developing areas in display technology.

In order to avoid driving chips of an LCD module of the curved screen display from colliding and pushing with each other, the curved screen display needs to retain more accommodation space for the staggered, stacked driving chips. Thus industrial design (ID) of the curved screen display is limited. If the accommodation space within the curved screen display is reduced, the driving chip of the LCD module might be over-bended, or even cause the risk of peeling. Therefore, how to produce a curved screen display with a fine and stable connection quality is one of the problems that the person skilled in the art intends to solve.

SUMMARY

The disclosure provides a display module, and the display module includes display panel, a plurality of first flexible connectors, a plurality of second flexible connectors and printed circuit board. The first flexible connectors connect to the display panel. Each of the second flexible connectors connects to one of the first flexible connectors, and the second flexible connectors further electronically connect to printed circuit board.

As mentioned above, the display module of the embodiment of the present disclosure has the first flexible connectors and the second flexible connectors, provides sufficient wiring length between the display panel and the printed circuit board as well as the freedom of movement and rotation of the printed circuit board, maintaining the connection quality between the display panel and the printed circuit board.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
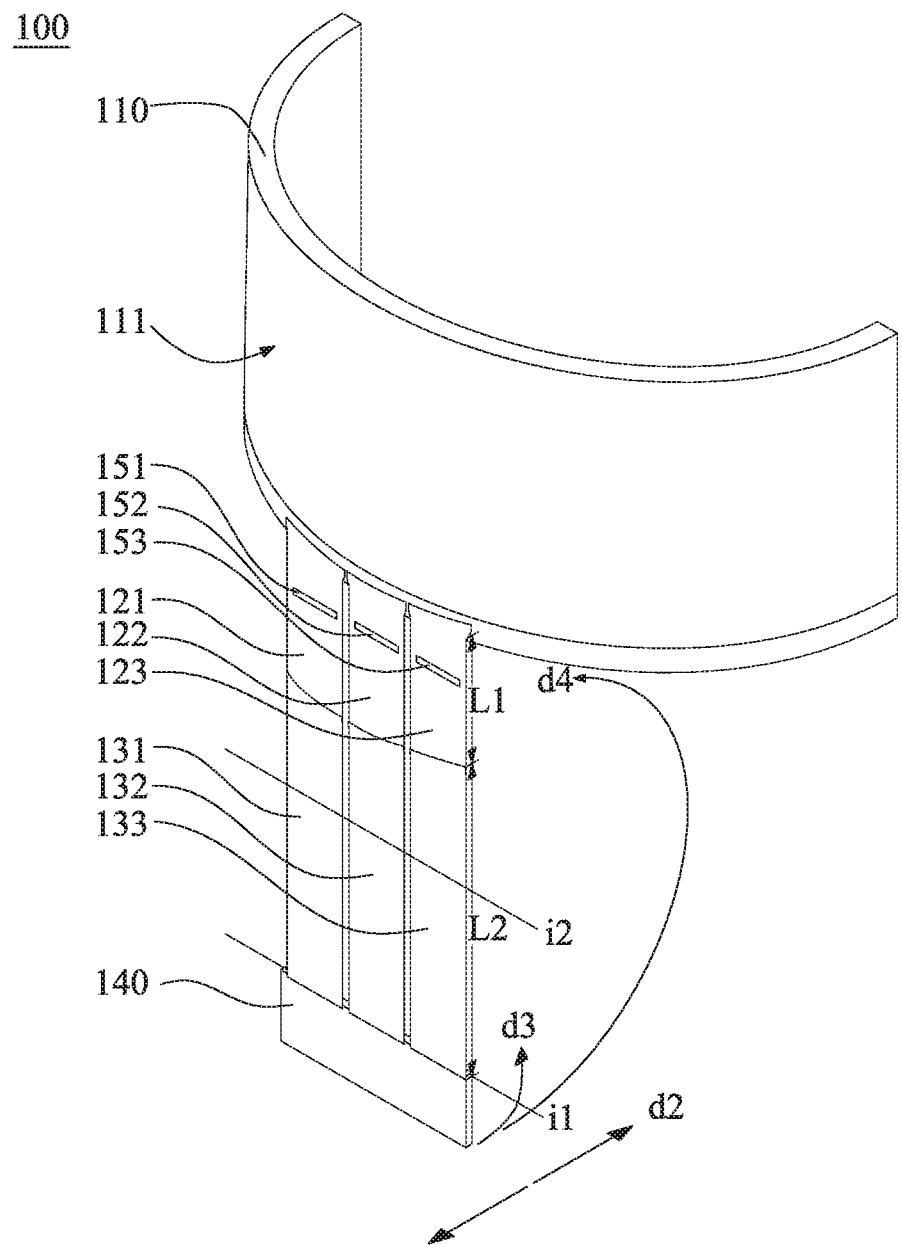
FIG. 1A is a schematic perspective view of the display module according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

A display module of an embodiment of the present disclosure can be applied to a curved screen. In an embodiment, the curved screen can be LCD or OLED display, but the present disclosure is not limited to these applications.

It is to be understood that, though the technical terms "the first", "the second" and etc. in the text can be used to describe different devices, components, or parts, but the devices, components or parts should not be limited by these technical terms. The technical terms are used to differentiate one device, component or part from others. Thus, "the first device", "the first component" or "the first part" can also be called "the second device", "the second component" or "the second part" without departing from the teaching herein.

In the attached figures, the thickness of layers, film, panel, area, etc. is enlarged or minified for the sake of clarity. It is to be understood that, when layer, film, area, device of substrate, etc. is said to be "on" or "connected to" another device, it can be directly disposed on or directly connected to another device, or there can be device in between. On the contrary, when device is said to be "directly on" another device or "directly connected to" another device, there is no device in between existed. The "connection" used in the text can be refer to physical or electronical connection. Furthermore, two "electronical connected" or "coupling" device can have other devices between the two devices.

Please refer to FIG. 1A, which is the schematic perspective view of display module of an embodiment of the present disclosure. In an embodiment of the present disclosure, a display module 100 includes a display panel 110, first flexible connectors 121, 122 and 123, second flexible connectors 131, 132 and 133, and a printed circuit board 140. In the embodiment, the first flexible connectors 121, 122 and 123 are electronically connected to the display panel 110. The second flexible connectors 131, 132, and 133 are electrically connected to the first flexible connectors 121, 122, and 123 respectively, and the second flexible connectors 131, 132, and 133 are electrically connected to the printed circuit board 140.

To be specific, in the embodiment, the first flexible connector 121 connects the second flexible connector 131 to form a connecting circuit, and the first flexible connector 122 connects the second flexible connector 132 to form another connecting circuit, and the first flexible connector 123 connects the second flexible connector 133 to form another connecting circuit. The printed circuit board 140 is, for instance, adapted to provide driving signal, and the first flexible connectors 121, 122, 123 and the second flexible connectors 131, 132, 133 are adapted to transfer the driving signal. Therefore, the first flexible connectors 121, 122 and 123 and the second flexible connectors 131, 132 and 133 can form a plurality of (3 for example here) connecting circuits transmitting the driving signal between the display panel 110 and the printed circuit board 140.

In the embodiment, the first flexible connectors 121, 122, and 123 and the second flexible connectors 131, 132 and 133 extend the length of the connecting circuits between the display panel 110 and printed circuit board 140. By extending the distance between the display panel 110 and the printed circuit board 140, the first flexible connectors 121, 122 and 123 are prevented from peeling off from the display panel 110. Moreover, the second flexible connectors 131, 132 and 133 are also prevented from peeling off from the printed circuit board 140, thus proving a fine connection between the display panel 110 and the printed circuit board 140.

For example, please refer to FIG. 1A, the display panel 110 is, for instance, a curved display panel with a display surface 111, which is curved, and the printed circuit board 140 is, for instance, flat. With the connection of the first flexible connectors 121, 122 and 123 and the second flexible connectors 131, 132 and 133, the connecting circuits between the display panel 110 and the printed circuit board 140 will not be bent in a large angle, so that the circuit can be prevented from peeling.

Furthermore, in the display module 100 of the embodiment, the printed circuit board 140 can have a more flexible space for moving and rotating. For example, in the embodiment, the printed circuit board 140 can move along direction d1 or direction d2, allowing the display module 100 to be installed in a casing with more flexibility.

Moreover, with the connection of the first flexible connectors 121, 122 and 123 and the second flexible connectors 131, 132 and 133, the printed circuit board 140 of the embodiment can also rotate along an axis i1 toward a direction d3, so that the printed circuit board 140 can be horizontally disposed. Further, the printed circuit board 140 of the embodiment can also be rotated along an axis i2 toward direction d4, so that the printed circuit board 140 can be moved to an area adjacent to the back of the display surface 111. Therefore, the display module 100 of the embodiment can provide sufficient freedom of movement and rotation for the printed circuit board 140 by the first flexible connectors 121, 122 and 123 and the second flexible connectors 131, 132 and 133, and can also maintain fine connection between the display panel 110 and the printed circuit board 140.

In the embodiment, the first flexible connectors 121, 122 and 123 can include flexible printed circuit (FPC), but the present disclosure is not limited thereto. What needs to be specified is that, to clarify the relative positions of each device in the referred figure of the embodiment, the printed circuit in FPC is omitted, however, the present disclosure is not limited to the printed circuit design of FPC, and the figure is not intended to limit the present disclosure.

In the embodiment, the display module 100 further includes driving chips 151, 152 and 153. The driving chips 151, 152 and 153 are disposed on the first flexible connectors 121, 122 and 123 respectively. To be explicit, the driving chips 151, 152 and 153 are, for instance, the driving chips of the display panel 110, and the driving chips 151, 152 and 153 are formed respectively on the first flexible connectors 121, 122 and 123 by, for instance, chip on film (COF).

In the embodiment, the first flexible connectors 121, 122 and 123 and the second flexible connectors 131, 132 and 133 are connected through hot bar.

Figure 1B:
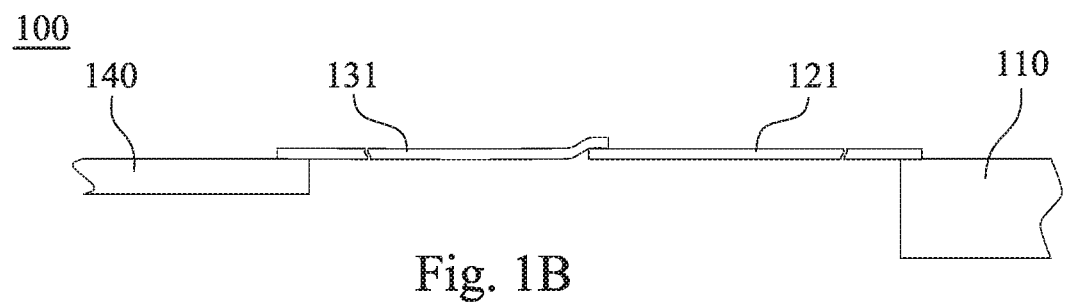
FIG. 1B is a schematic sectional view of the display module according to an embodiment of the present disclosure.

To be specific, the second flexible connectors 131, 132 and 133 of the embodiment can also include FPC. Please refer to FIG. 1B, which is a schematic sectional view of the display module 100 of the embodiment illustrating the first flexible connector 121 and the second flexible connector 131 as an example. In the embodiment, the printed circuit board 140 and the second flexible connector 131 can be connected through hot bar, the first flexible connector 121 and the second flexible connector 131 can be connected through hot bar, and the first flexible connector 121 and the display panel 110 can also be connected through hot bar. Furthermore, please also refer to FIG. 1A, the first flexible connector 122 and the second flexible connector 132 can be connected through hot bar, whereas the first flexible connector 123 and the second flexible connector 133 can also be connected through hot bar, forming the connecting circuits between the printed circuit board 140 and the display panel 110.

With the second flexible connectors 131, 132 and 133 of the embodiment, the connecting circuits between the display panel 110 and the printed circuit board 140 can be further extended, so as to provide a greater freedom of movement for the printed circuit board 140. In the embodiment, the first flexible connectors 121, 122 and 123 substantially have the same length L1, and the second flexible connectors 131, 132 and 133 also substantially have the same length L2, but the present disclosure is not limited thereto. The following will provide other embodiments to specified designs of flexible connectors with different lengths.

For instance, in the aforementioned embodiment, when the size of the display surface 111 of the display panel 110 is 43 inches, and the lengths L2 of the second flexible connectors 131, 132 and 133 fall in a range from 100 mm to 120 mm, so as to provide the printed circuit board 140 sufficient freedom of movement.

Figure 2:
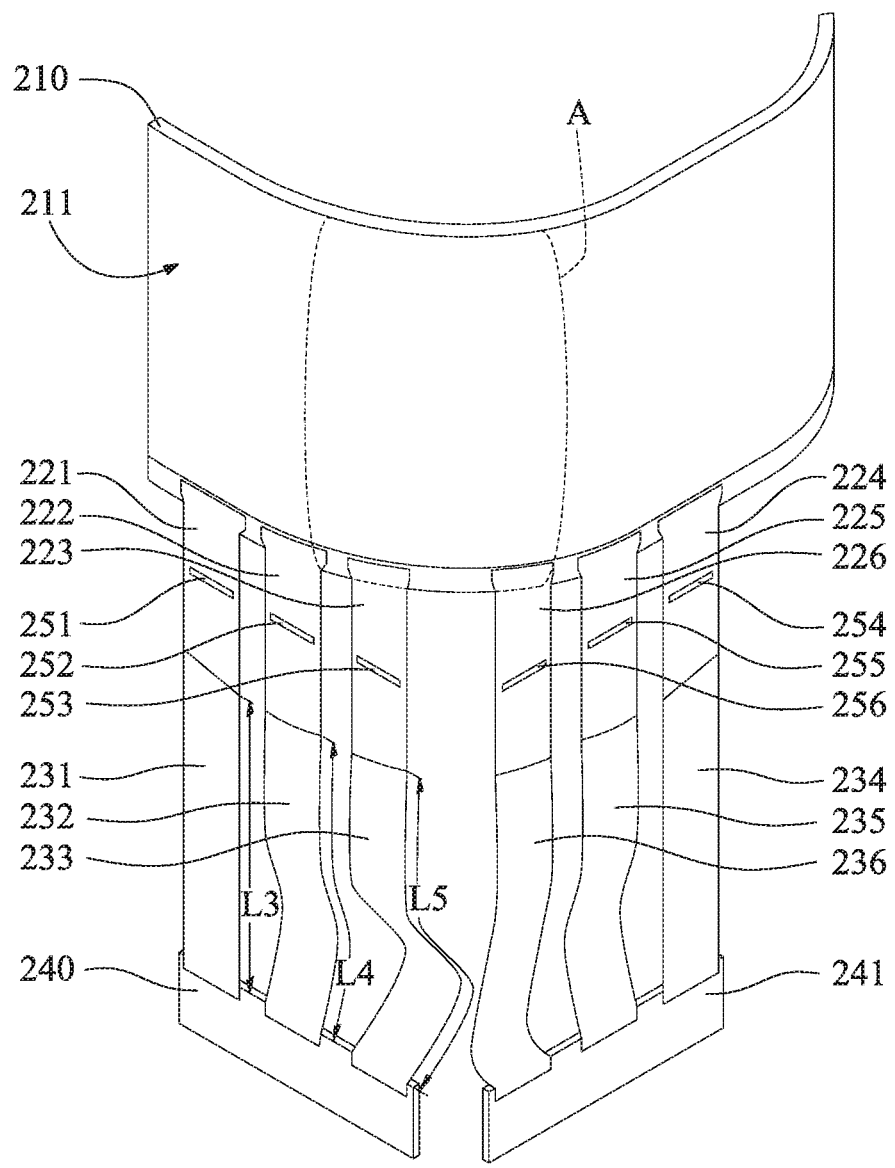
FIG. 2 is a schematic perspective view of the display module according to another embodiment of the present disclosure.

FIG. 2 is a schematic perspective view of display module of another embodiment of the present disclosure. Please refer to FIG. 2, a display module 200 of another embodiment of the present disclosure has a display panel 210, first flexible connectors 221-226, second flexible connectors 231-236 and printed circuit board 240. The first flexible connectors 221-226 electronically connect to the display panel 210. The second flexible connectors 231-236 electronically connect to the first flexible connectors 221-226 respectively, and the second flexible connectors 231-236 electronically connect to the printed circuit board 240 respectively.

In the embodiment, the display module 200 includes driving chips 251-256. The driving chips 251, 252 and 253 are disposed on the first flexible connectors 221, 222 and 223 respectively, and the driving chips 254, 255 and 256 are disposed on the first flexible connectors 224, 225 and 226 respectively. To be specific, the driving chips 251-256 are, for instance, driving chips of the display panel 210, and the driving chips 251-256 respectively form on the first flexible connectors 221-226 by, for instance, COF.

In the embodiment, the display panel 210 includes a display surface 211, and the display surface 211 is curved, and the display surface 211 further has a curved area A, and the display surface 211 in the curved area A has minimum curvature radius. That is, in the display panel 210, the display surface 211 in the curved area A has a maximum degree of curvature.

Taking the second flexible connectors 231-233 connecting the printed circuit board 241 as an example. In the embodiment, a length L5 of the second flexible connector 233 adjacent to the curved area A is longer than a length L4 of the second flexible connector 232, whereas a length L3 of the second flexible connector 231 away from the curved area A is less than the length L4 of the second flexible connector 232. Therefore, the side of the printed circuit board 240 which is near another printed circuit board 241 has a greater freedom of movement. When the display module 200 of the embodiment is disposed in a casing, the first flexible connectors 221-226 and the second flexible connectors 231-236 can avoid the printed circuit board 240 being obstructed by the printed circuit board 241.

Figure 3A:
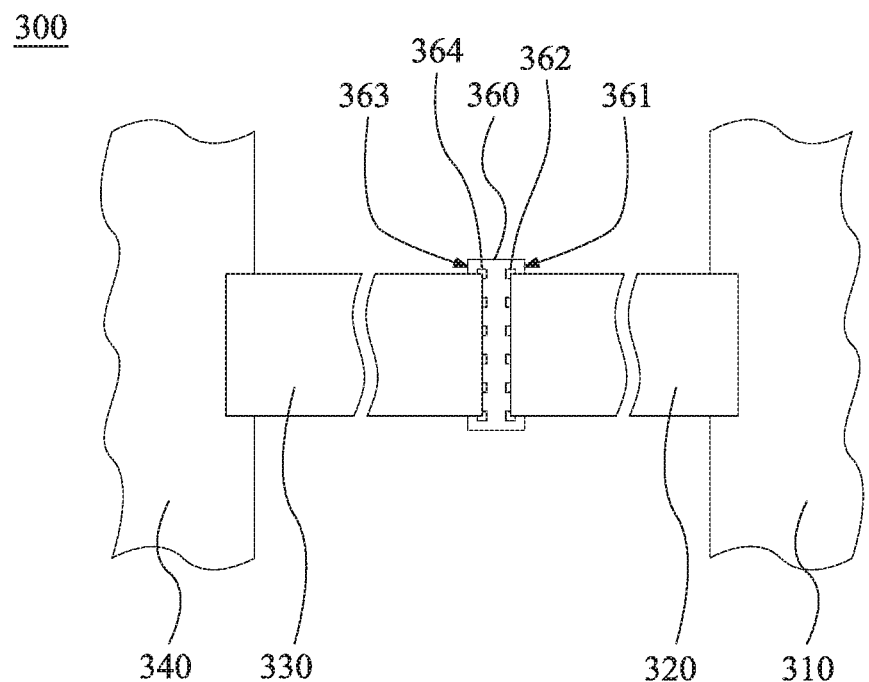
FIG. 3A is a schematic partial view of the display module according to still another embodiment of the present disclosure.

Furthermore, in some embodiments of the present disclosure, connection between the display panel 110 and the printed circuit board 140 is not limited to the manner of the first flexible connectors 121-123 and the second flexible connectors 131-133. FIG. 3A is a schematic partial view of display module of another embodiment of the present disclosure. Please refer to FIG. 3A, in another embodiment of the present disclosure, display module 300 may have an adapter 360 which is connected between the first flexible connector 320 and the second flexible connector 330, and the first flexible connector 320 is connected to display panel 310. The second flexible connector 330 is connected to printed circuit board 340. Specifically, the display module 300 of the embodiment can substantially include a plurality of adapters 360 respectively connected to a plurality of the first flexible connectors 320 and a plurality of the second flexible connectors 330, and here takes only one description as an example, and it not intended to limit the present disclosure.

Please refer to FIG. 3A, in the embodiment, the adapter 360 has a first connecting side 361 and a second connecting side 363 disposed opposing to the first connecting side 361. The adapter 360 further includes a plurality of first metal contacts 362 and a plurality of second metal contacts 364, and the first metal contacts 362 are disposed on the first connecting side 361; the second metal contacts 364 are disposed on the second connecting side 363.

In the embodiment, the first metal contacts 362 of the adapter 360 is connected to one of the first flexible connectors 320 through hot bar, and the second metal contact 364 of the adapter 360 is connected to one of the second flexible connector 330 through hot bar.

For example, the first flexible connector 320 and the second flexible connector 330 of the embodiment can include, for instance, FPC. Therefore, in the display module 300 in the embodiment of the present disclosure, between the first flexible connector 320 and the second flexible connector 330, an adapter 360 can be selected to connect the first flexible connector 320 to the second flexible connector 330 according to a user's working machine.

Figure 3B:
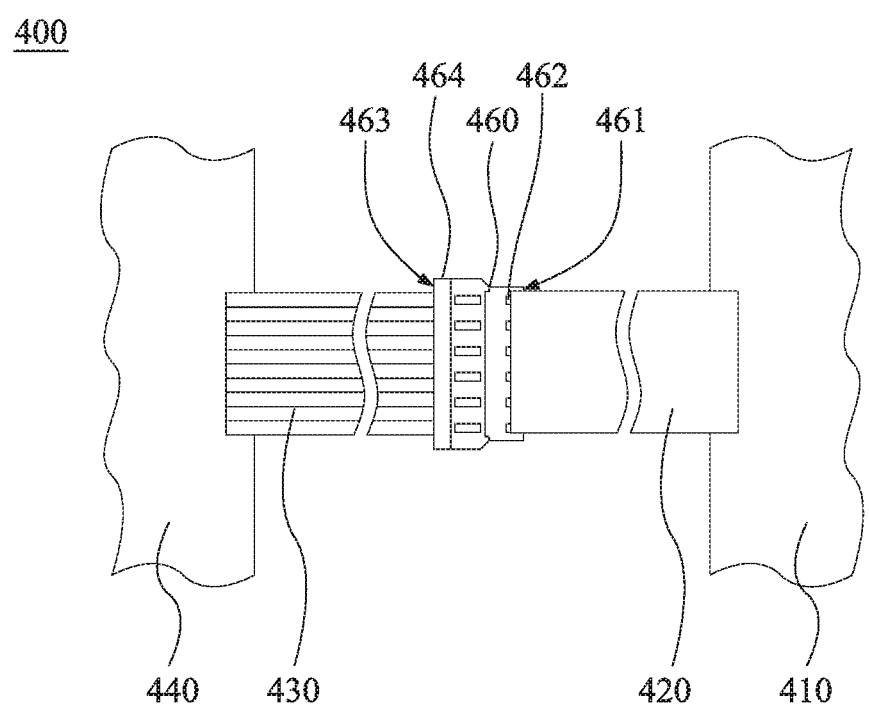
FIG. 3B is a schematic partial view of the display module according to yet another embodiment of the present disclosure.

The present disclosure is not limited to the adapter 360. FIG. 3B is the schematic partial view of the display module of still another embodiment of the present disclosure. Please refer to FIG. 3B, display module 400 can further include an adapter 460, and a second connecting side 463 of the adapter 460 is configured with a coupler 464. To be specific, the adapter 460 connects the first flexible connector 420 and the second flexible connector 430, and the first flexible connector 420 connects the display panel 410, and the second flexible connector 430 connects the printed circuit board 440.

The adapter 460 of the embodiment includes a first connecting side 461 and the second connecting side 463 disposed opposite to the first connecting side 461. A plurality of first metal contacts 462 of the adapter 460 are disposed on the first connecting side 461, and the first flexible connector 420 and the first metal contacts 462 can be connected through hot bar, whereas the second flexible connector 430 can be coupled with the coupler 464 of the second connecting side 463.

To be specific, the second flexible connector 430 of the embodiment of the present disclosure is not limited to the aforementioned FPC, the second flexible connector 430 may have flexible flat cable (FFC) and a coupler, whereas the second connecting side 463 of the adapter 460 can include coupler corresponding to FFC, so that the second connecting side 463 of the adapter 460 is fit for connecting the second flexible connector 430. Since the second flexible connector 430 of the embodiment can include FFC, the production cost of the adapter 460 and the second flexible connector can be reduced. Moreover, the adapter 460 can achieve a fine electrical connection with impedance matching provided by the second flexible connector 430.

In conclusion, display module of the embodiment of the present disclosure can maintain sufficient length of connecting circuit between printed circuit board and display panel by first flexible connectors and second flexible connectors, so as to provide sufficient freedom of movement and rotation for printed circuit board, maintaining fine connection.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A display module, comprising:
  a display panel having a display surface, the display surface being curved and having a curved area, the display surface of the curved area having a minimum curvature radius;
  a plurality of first flexible connectors electronically connecting to the display panel;
  a plurality of second flexible connectors electronically connecting to the first flexible connectors respectively, a length of one of the second flexible connectors adjacent to the curved area is longer than a length of another one of the second flexible connectors disposed away from the curved area; and
  a printed circuit board,
  wherein the second flexible connectors electronically connect to the printed circuit board.
2. The display module of claim 1, further comprising:
  a plurality of driving chips being disposed on the first flexible connectors respectively.
3. The display module of claim 1, wherein lengths of the first flexible connectors are the same.

4. The display module of claim 1, wherein the first flexible connectors and the second flexible connectors are connected through hot bar.

5. The display module of claim 1, further comprising:
a plurality of adapters connecting between the first flexible connectors and the second flexible connectors respectively.

6. The display module of claim 5, wherein the adapters respectively comprises:
a first connecting side;
a plurality of first metal contacts disposed on the first connecting side;
a second connecting side disposed opposite to the first connecting side; and
a plurality of second metal contacts disposed on the second connecting side,
wherein the first metal contacts are connected to one of the first flexible connectors through hot bar, and the second metal contacts are connected to one of the second flexible connectors through hot bar.

7. The display module of claim 5, wherein each of the adapters comprises:
a first connecting side;
a plurality of first metal contacts disposed on the first connecting side;
a second connecting side disposed opposite to the first connecting side; and
a coupler disposed on the second connecting side,
wherein the first metal contacts are connected to one of the first flexible connectors through hot bar, and the coupler couples with one of the second flexible connectors.

8. The display module of claim 1, wherein each of the second flexible connectors has a length of 100 mm to 120 mm.

9. The display module of claim 1, wherein lengths of the second flexible connectors are different from each other.

* * * * *